United States Patent [19]

Bouvier

[11] Patent Number: 6,052,055
[45] Date of Patent: Apr. 18, 2000

[54] PORTABLE ELECTRONIC OBJECT FOR REMOTE INFORMATION EXCHANGE

[75] Inventor: Jacky Bouvier, Meylan, France

[73] Assignee: France Telecom, Paris, France

[21] Appl. No.: 09/155,757

[22] PCT Filed: Apr. 2, 1997

[86] PCT No.: PCT/FR97/00584

§ 371 Date: Feb. 26, 1999

§ 102(e) Date: Feb. 26, 1999

[87] PCT Pub. No.: WO97/38391

PCT Pub. Date: Oct. 16, 1997

[30] Foreign Application Priority Data

Apr. 3, 1996 [FR] France ................................. 96 04179

[51] Int. Cl.[7] .............................................. G08B 13/14
[52] U.S. Cl. .................................... 340/572.1; 340/572.4
[58] Field of Search .......................... 340/572.1, 572.4, 340/572.6, 572.2, 539, 825.54, 505; 455/42, 44, 106, 107, 108

[56] References Cited

U.S. PATENT DOCUMENTS

| | | | |
|---|---|---|---|
| 5,523,749 | 6/1996 | Cole et al. | 340/825.54 |
| 5,552,778 | 9/1996 | Schrott et al. | 340/825.34 |
| 5,559,507 | 9/1996 | Beigel | 340/825.54 |
| 5,661,459 | 8/1997 | Belcher | 340/572.1 |
| 5,751,223 | 5/1998 | Turner | 340/825.54 |
| 5,767,789 | 6/1998 | Afzali-Ardakani et al. | 340/825.54 |
| 5,838,235 | 11/1998 | Thorigne | 340/572.1 |
| 5,883,582 | 3/1999 | Bowers et al. | 340/825.54 |
| 5,923,251 | 7/1999 | Raimbault et al. | 340/572.4 |

*Primary Examiner*—Jeffery A. Hofsass
*Assistant Examiner*—Toan Pham
*Attorney, Agent, or Firm*—Conley, Rose & Tayon, PC

[57] ABSTRACT

A memory card, capable of remotely exchanging information with a terminal by modulating a magnetic field generated by said terminal, includes a voltage limiter (LMT) with an input terminal (BE) for receiving, during the transmission of information between the terminal and the card, an amplitude modulated voltage (VNR) with a time-varying average voltage level (NM). A primary transistor (TZ1) is connected between the input terminal and ground. Diodes (D1...DN) are series connected between the input terminal (BE) and ground and between the input terminal (BE) and the gate of the primary transistor (TZ1), wherein the threshold voltages of the diodes and primary transistor define a limit value for the input voltage. A capacitor (C) is connected between the primary transistor gate and ground. A resistive array (RD, TR) is connected between the capacitor and ground, and forms, with the capacitor, a resistive/capacitive array with a time constant selected so as to be comprised between the time variation period of the average voltage level and the amplitude modulation period.

12 Claims, 2 Drawing Sheets

PORTABLE ELECTRONIC OBJECT FOR REMOTE INFORMATION EXCHANGE

BACKGROUND OF THE INVENTION

1. Field of the Invention

Generally, the invention relates to the remote exchange of information between a portable electrical object, in particular an electronic memory card or chip card, and a terminal by modulation of the magnetic field generated by the terminal.

In this kind of remote data exchange, the magnetic field generated by the terminal serves to energize the electronic components of the portable object, and simultaneously to transmit digital data by modulation.

Various kinds of modulation can be envisaged.

2. Description of the Related Art

At present, use is generally made of frequency or phase modulation for transmitting information between the terminal and the object. In the direction of transmission from the portable object to the terminal, use is generally made of absorption modulation.

For transmission from the terminal to the portable object, it is also possible to envisage another type of modulation, namely amplitude modulation, this offering the advantage of avoiding the use of phase-locked loops and therefore leading to a simple system.

However, given that the portable object, energized by the magnetic field, is subjected to displacements within the magnetic field, especially when the user moves his card towards the terminal and then away from it, the voltage recovered at card level increases when the card is very close to the radiating antenna of the terminal, and may easily reach the breakdown voltage of the junctions of the transistors, thus leading to an impairment of the operation of the electronic components of this card. It is therefore necessary to limit this recovered voltage to a limit value. However, straightforward clipping of the voltage would cause the amplitude modulation of the latter to disappear, which modulation supports the information exchanges.

SUMMARY OF THE INVENTION

The objective of the invention is therefore to afford a solution to this problem and, in particular, to limit the variation in recovered voltage whilst also preserving the digital information contained in this recovered voltage, and to do so in both directions of transmission.

In an embodiment a process for the remote exchange of information between a portable electronic object, in particular a memory card, and a terminal is preferably accomplished by modulation of the magnetic field generated by the terminal. When transmitting information from the terminal to the object, an amplitude modulation of the magnetic field is performed, and when the energizing voltage thus modulated and recovered at an input port of the portable object exceeds a chosen limit value during a modulation peak, this voltage is clipped to said chosen limit value whilst also causing a current to flow through a main transistor connected between said input port arid earth, then, during a modulation trough, a current having a value substantially equal to that of the current flowing during the modulation peak is caused to flow through this main transistor.

Thus, since a substantially constant current is maintained in the transistor between a modulation peak and trough, and since the magnetic field energy or power delivered by the terminal varies between a modulation peak and trough, a decrease will be observed in the voltage energizing the portable object during a modulation trough. Stated otherwise, although the energizing voltage is clipped during a modulation peak, the decrease in its value during a modulation trough will make it easy to detect the variation in the amplitude of the voltage and hence will make it possible not to lose the information transmitted.

The current in the transistor is advantageously kept substantially constant between a modulation peak and trough by keeping he gate voltage of the transistor substantially constant.

For transmitting information from the object to the terminal, which is performed by absorption modulation, an auxiliary transistor mounted in current-mirror mode with the main transistor is switched on or off depending on the logic value of the information bits to be transmitted.

Stated otherwise, depending on the logic value of the bits transmitted, the absorption current flowing through the main transistor is supplemented with an additional absorption current flowing through the auxiliary transistor.

In an embodiment to a portable electronic object, in particular a memory card, is preferably capable of exchanging information remotely with a terminal by modulation of the magnetic field generated by the terminal. This object comprises a voltage limiter consisting of an input port for receiving, when transmitting information between the terminal and the object, an amplitude-modulated voltage whose mean level is able to vary temporally. This voltage limiter moreover comprises a main transistor connected between the input port and earth, as well as a set of diodes connected in series on the one hand between the input port and earth and on the other hand between the input port and the gate of the main transistor. The threshold voltages of the diodes and of the main transistor define a limit value of the input voltage. A capacitor is also provided, connected between the gate of the main transistor and earth, as well as a resistive network connected between the capacitor and earth and forming with this capacitor a resistive/capacitive network whose time constant is chosen to lie between the duration of temporal variation of the mean level of the voltage and the period of the amplitude modulation.

According to one embodiment, the set of diodes comprises a first terminal diode whose cathode is connected directly to the gate of the main transistor and a second terminal diode whose anode is linked to the anode of the first terminal diode and whose cathode is linked to earth by way of a biasing resistor. The resistive network comprises, in addition to the biasing resistor, a second field-effect transistor connected in series between this biasing resistor and the gate of the main transistor, the gate of this second field-effect transistor being linked to earth. This first terminal diode, although not indispensable, can be used to charge the capacitor and therefore enables the charging time to be reduced.

So as not to lose information when transmitting from the portable object to the terminal, the voltage limiter advantageously comprises a control input able to receive a control signal whose value depends on the value of the bits of the information transmitted from the object to the terminal, and an auxiliary transistor mounted in current-mirror mode with the main transistor by way of a switch controlled by the control signal.

According to one embodiment, the auxiliary transistor is connected between the input port and earth, and the switch consists of two complementary transistors whose gates are linked to the control input, one of these two transistors being connected between the gate of the main transistor and the gate of the auxiliary transistor whilst the other transistor is connected between the gate of the auxiliary transistor and earth.

BRIEF DESCRIPTION OF THE DRAWINGS

Other advantages and characteristics will emerge on examining a wholly nonlimiting embodiment together with the appended drawings, in which.

DETAILED DESCRIPTION OF THE INVENTION

Figure 1:
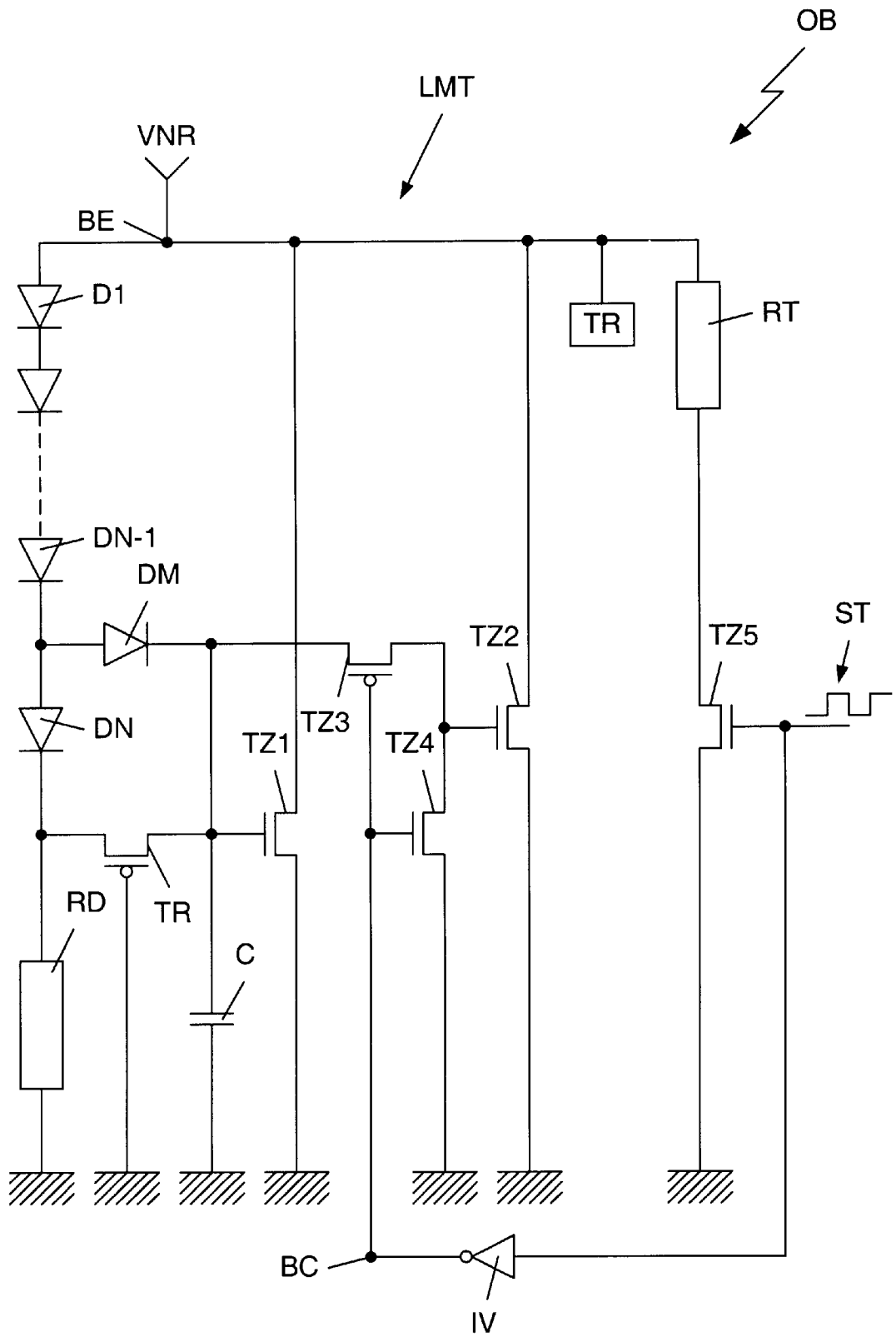
FIG. 1 is a diagrammatic schematic of a voltage limiter according to the invention.

As illustrated in FIG. 1, the portable object OB, for example a "chip" card, consists of a voltage limiter LMT possessing an input port BE for receiving a rectified energizing voltage VNR emanating from a primary block of conventional structure, not represented here for the sake of simplicity, connected to a receiving antenna, likewise not represented. This primary block of conventional structure provides for the functions of rectification, filtering and also stabilization so as to deliver a stabilized energizing voltage.

The limiter LMT moreover consists of a set of diodes D1–DN connected in series. More precisely the anode of the first diode D1 is connected to the input port BE whilst the cathode of the terminal diode DN is linked to earth by way of a biasing resistor RD. An N-channel field-effect transistor TZ1, termed the main transistor, is connected, at its drain and its source, between the input port BE and earth. The gate of this transistor TZ1 is connected to the cathode of another terminal diode DM whose anode is linked to the anode of the terminal diode DN. The function of this diode DM will be explained in greater detail below.

The gate of the transistor TZ1 is also linked to earth by way of a capacitor C. This gate is lastly connected to the cathode of the diode DN by way of a second, P-channel, field-effect transistor TR whose gate is linked to earth.

A data processing block referenced TR, comprising a logic block and a memory block, of conventional structure, R is connected to the input port BE and is intended to extract the information transmitted from the terminal.

To provide for transmission from the object to the terminal, the voltage limiter furthermore comprises an auxiliary transistor TZ2 mounted in current-mirror mode with the transistor TZ1 by way of a switch formed here of two complementary field-effect transistors TZ3 and TZ4.

More precisely, the transistor TZ2 is connected at its drain and its source between the input port BE and earth whilst its gate is linked on the one hand to earth by way of the N-channel transistor TZ4, and on the other hand to the gate of the transistor TZ1 by way of the P-channel transistor TZ3. The gates of the two transistors TZ3 and TZ4 are linked together and this common point constitutes a control input BC for the switch TZ3, TZ4. More precisely, this control port BC receives, by way of an inverter IV, the logic signal ST which contains the information to be transmitted and is delivered by a processing block which is not represented here for the sakes of simplicity. Of course, the portable object also comprises, in the conventional manner, for transmitting information from the card to the terminal, a transistor TZ5 connected between earth and the input port BE by way of a resistor RT, and controlled on its gate by the signal ST.

The manner of operation of the device will now be described in greater detail while referring additionally to FIGS. 2 and 3.

The set of diodes D1 . . . DN–1 and DM as well as the main transistor TZ1 in fact form, in CMOS technology, a Zener diode whose Zener voltage is equal to the sum of the threshold voltage of the transistor TZ1 and of the threshold voltages of the various diodes. It is thus possible to adjust the Zener voltage by installing a greater or lesser number of diodes. This Zener voltage therefore constitutes the limit value for clipping the voltage VNR. In practice, by installing eleven diodes with a threshold voltage of the order of 0.6 to 0.7 V, and by using a transistor TZ1 whose threshold voltage is of the order of 0.5 V, the voltage VNR will be clipped to around 8 V, the latter lying below the breakdown voltage of the various junctions of the electronic components, which is of the order of 10 to 11 V.

Figure 2:
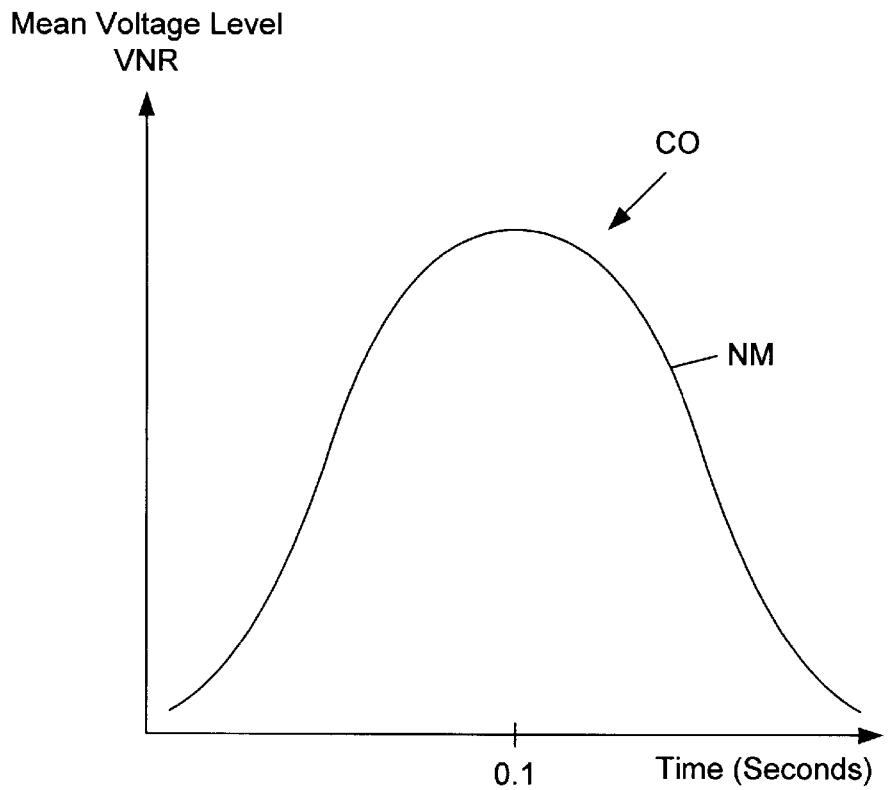
FIG. 2 illustrates very diagrammatically the temporal variation in the mean level of the energizing voltage during a displacement of the card within the magnetic field, without a voltage limiter.

In particular, in an application of the "automatic barrier" type, wshen the owner of the card approaches the terminal, holds out his card towards it, and then moves away from it on crossing the barrier, the mean level NM of the energizing voltage VNR generally follows the curve CO of FIG. 2 when the card is not equipped with a voltage limiter according to the invention. When thee card is equipped with a voltage limiter, this mean level is clipped. The period of variation of this voltage is customarily of the order of a few tenths of a second. In particular, it is when the card is very close to the terminal, that is to say in the vicinity of the hump in the curve CO, that there is a risk that the energizing voltage will reach the breakdown voltage and that it is advisable to limit its value.

Figure 3:
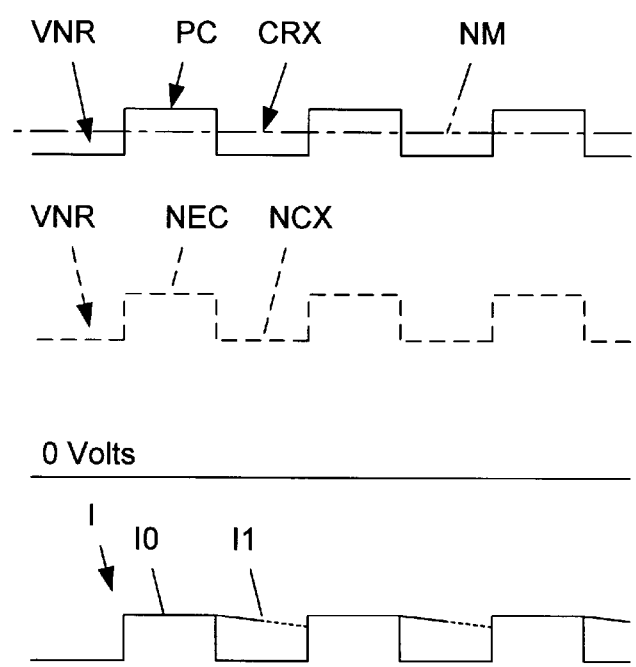
FIG. 3 illustrates diagrammatically the variations in the energizing voltage and in the current branched through the main transistor, during modulation peaks and troughs, without (solid lines) and with (dashed lines) a voltage limiter.

For transmitting information from the terminal to the card, the voltage VNR is, as illustrated in solid lines at the top of FIG. 3, amplitude-modulated about its mean level NM. This modulated voltage VNR thus consists of modulation peaks PC and troughs CRX, the period of which is of the order of 104 microseconds.

When, in particular during a modulation peak PC, the energizing voltage VNR exceeds the chosen limit value, in this instance of the order of 8 V, the voltage VNR is in fact clipped by the Zener diode to the value of the Zener voltage, and the transistor TZ1, whose threshold voltage is attained, then begins to conduct, the drain/source conduction current I then having the value I0 (bottom of FIG. 3).

Moreover, the capacitor C charges up to the threshold voltage of the transistor by way of the diode DM. The charging time constant of the capacitor is defined by the product n.Rz.C (where n is the number of diodes (here 11) and Rz is the conduction resistance of a diode) and is less than the period of variation of the mean level of the voltage. In practice, the charging time constant is of the order of 10 microseconds (n.Rz=600 k$\Omega$ and C=20 pF).

The presence of the diode DM precludes the charging of the capacitor C by way of the transistor TR which has a large impedance and thus makes it possible to limit the charging time constant.

Throughout the time of the modulation peak, the voltage VNR is clipped to the level NEC (top of FIG. 3, dashed lines).

During the following modulation trough, that is to say when the level of the voltage VNR drops, the diode DM goes into reverse and the capacitor C discharges into the resistive network made up of the resistor RD and the transistor TR. The discharge time constant, which here is equal to the product of the capacitance C times the sum of the resistance RD (here 140 kΩ) and of the drain resistance (here 20 MΩ) of the transistor TR, is chosen to be large compared with the period of the amplitude modulation and small relative to the period of temporal variation of the mean level of the voltage. In practice, this discharge time constant is taken to be equal to 500 μs.

Taking into account the value of this discharge time constant, the gate voltage of the transistor TZ1 is kept substantially constant during the modulation trough CRX and, consequently, the value I1 of the conduction current of the transistor TZ1 is substantially identical to the current I0 which flowed during the modulation peak.

Consequently, since the energy transmitted by the terminal during a low modulation trough, and since the conduction current of the transistor TZ1 remains substantially constant, the value of the voltage VNR falls, dropping to the level NCX (top of FIG. 3, dashed lines). Hence, the variation in voltage between the clipped level NEC and the level NCX remains sufficient to be able correctly to discern a modulation edge.

The person skilled in the art will note here that a straightforward clipping of the voltage during the modulation peaks, without maintaining the conduction current in the transistor during a modulation trough, would have led to a clipped voltage of substantially constant level between a modulation trough and a peak, which would have prevented a modulation edge from being discerned.

For transmitting data from the card to the terminal, this is done by detecting the absorption of energy consumed by the portable object. Stated otherwise, transmission is performed in this direction by absorption modulation.

The case in which the voltage VNR is greater than the chosen threshold voltage still holds, the main transistor TZ1 conducting.

Conventionally, when transmitting a bit of logic value 1 (signal ST in the high state), the transistor TZ5 conducts and creates an additional current inrush. However, without the presence of the transistor TZ2 and of the switch formed by the transistors TZ3 and TZ4, the Zener diode of the voltage limiter would absorb the surplus energy, and this would prevent the information transmitted from being discerned.

The transistor TZ2 mounted in current-mirror mode by way of the switch TZ3 and TZ4 makes it possible to remedy this drawback whilst also permitting the clipping of the energizing voltage.

More precisely, when the signal ST is in the low state, corresponding to the sending of a bit of logic value zero, the voltage at the control port BC is in the high state (by virtue of the presence of the inverter IV). Thus, the transistor TZ4 conducts whilst the transistor TZ3 is off. The gate voltage of the transistor TZ2 being zero, the latter is off and the transistor TZ2 does not absorb any additional current.

By contrast, when the signal ST is in the high state, corresponding to the transmitting of a logic bit of value 1, the transistor TZ4 is off whilst the transistor TZ3 is conducting. Thus, the transistor TZ2 conducts with a current equal to the conduction current of the transistor TZ1. Hence, this results in an additional absorption current as compared with the previous case, thereby making it possible to discern without difficulty the additional absorption occasioned by the transmitting of the logic bit of value 1.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

I claim:

1. Process for the remote exchange of information between a portable electronic object and a terminal by modulation of a magnetic field generated by the terminal, comprising: performing an amplitude modulation of the magnetic field when transmitting information from the terminal to the object and, when an energizing voltage thus modulated and recovered at an input port of the portable object exceeds a chosen limit value during a modulation peak, the energizing voltage is clipped to said chosen limit value while also causing a first current to flow through a main transistor connected between the input port and earth, and then, during a modulation trough, a second current having a value substantially equal to that of the first current flowing during the modulation peak is caused to flow through the main transistor.

2. Process according to claim 1, wherein a current in the main transistor is kept substantially constant between the modulation peak and the trough by keeping a gate voltage of the main transistor substantially constant.

3. The process according to claim 2 wherein, when transmitting information from the object to the terminal an auxiliary transistor mounted in current-mirror mode with the main transistor is switched on or off depending on the logic value of information bits to be transmitted.

4. Process according to claim 1 wherein, when transmitting information from the object to the terminal, an auxiliary transistor mounted in current-mirror mode with the main transistor is switched on or off depending on the logic value of information bits to be transmitted.

5. The process according to claim 1, wherein the portable electronic object is a memory card.

6. A portable electronic object capable of exchanging information remotely with a terminal by modulation of a magnetic field generated by the terminal comprising: a voltage limiter comprising an input port for receiving, when transmitting information between the terminal and the object, an amplitude-modulated voltage whose mean level is able to vary temporally, a main transistor connected between the input port and earth, a set of diodes connected in series between the input port and earth or between the input port and a gate of the main transistor, wherein threshold voltages of the diodes and of the main transistor define a limit value of an input voltage, a capacitor connected between the gate of the main transistor and earth, and a resistive network comprising a biasing resistor and a second field-effect transistor, wherein the resistive network is connected between the capacitor and earth and forming, with the capacitor, a resistive/capacitive network whose time constant is chosen to lie between a duration of temporal variation of the mean level of the amplitude-modulated voltage and a period of the amplitude modulated voltage.

7. The electronic object according to claim 6 wherein the set of diodes comprises a first terminal diode whose cathode is connected to the gate of the main transistor and a second terminal diode whose anode is linked to the anode of the first terminal diode and whose cathode is linked to earth by way of the biasing resistor, and wherein the second field-effect transistor is connected in series between the biasing resistor and the gate of the main transistor, and wherein the gate of the second field-effect transistor is linked to earth.

8. The electronic object of claim 7 wherein the voltage limiter comprises a control input able to receive a control signal whose value depends on a value of bits of information transmitted from the object to the terminal, and an auxiliary transistor mounted in current-mirror mode with the main transistor by way of a switch controlled by a control signal.

9. The electronic object according to claim 8 wherein the auxiliary transistor is connected between the input port and earth, and wherein the switch comprises two complementary transistors whose gates are linked to the control input, one of these two transistors being connected between the gate of the main transistor and a gate of the auxiliary transistor, and wherein the other transistor is connected between the gate of the auxiliary transistor and earth.

10. The electronic object according to claim 6 wherein the voltage limiter comprises a control input able to receive a control signal whose value depends on a value of bits of information transmitted from the object to the terminal, and an auxiliary transistor mounted in current-mirror mode with the main transistor by way of a switch controlled by a control signal.

11. The electronic object according to claim 10 wherein the auxiliary transistor is connected between the input port and earth, and wherein the switch comprises two complementary transistors whose gates are linked to the control input, one of these two transistors being connected between the gate of the main transistor and a gate of the auxiliary transistor, and wherein the other transistor is connected between the gate of the auxiliary transistor and earth.

12. The electronic object of claim 6 wherein the portable electronic object is a memory card.

* * * * *